(12) United States Patent
Sato et al.

(10) Patent No.: US 9,666,651 B2
(45) Date of Patent: May 30, 2017

(54) DISPLAY DEVICE

(71) Applicant: Japan Display Inc., Tokyo (JP)

(72) Inventors: Toshihiro Sato, Tokyo (JP); Koji Yasukawa, Tokyo (JP); Masakazu Gunji, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/858,789

(22) Filed: Sep. 18, 2015

(65) Prior Publication Data

US 2016/0087019 A1   Mar. 24, 2016

(30) Foreign Application Priority Data

Sep. 22, 2014 (JP) ................................. 2014-192678

(51) Int. Cl.
*H01L 27/32* (2006.01)
*H01L 51/50* (2006.01)

(52) U.S. Cl.
CPC ...... *H01L 27/3246* (2013.01); *H01L 51/5056* (2013.01); *H01L 51/5088* (2013.01)

(58) Field of Classification Search
CPC . H01L 27/32; H01L 27/1292; H01L 27/3206; H01L 27/3211; H01L 27/3262
See application file for complete search history.

(56) References Cited

U.S. PATENT DOCUMENTS

2004/0232814 A1* 11/2004 Sakai .................. H01L 27/3211
313/310
2005/0057148 A1* 3/2005 Seki .................... H01L 27/3211
313/504
2006/0017371 A1* 1/2006 Yamada .............. H01L 27/3206
313/498
2007/0246723 A1* 10/2007 Moriya ............... H01L 27/1292
257/98
2012/0187425 A1 7/2012 Omoto
2012/0228589 A1* 9/2012 Mitsuya ............. H01L 51/5278
257/40

FOREIGN PATENT DOCUMENTS

| JP | 2009-295447 A | 12/2009 |
| JP | 2012-155953 A | 8/2012 |
| KR | 10-2004-0039789 A | 5/2004 |
| KR | 10-2012-0136432 A | 12/2012 |

OTHER PUBLICATIONS

Korean Office Action mailed Jan. 16, 2017 for corresponding Korean Patent Application No. 10-2015-0131000.

* cited by examiner

*Primary Examiner* — Phuc Dang
(74) *Attorney, Agent, or Firm* — Typha IP LLC

(57) ABSTRACT

A display device includes a plurality of pixel electrodes which are provided separately from each other on an insulative surface; a first layer which is provided separately from each other on the respective plurality of pixel electrodes, and includes a plurality of first carrier transport layers or a plurality of first carrier injection layers; a pixel separation film which is provided on the first layer, and includes a plurality of opening portions in each region which overlaps with the respective plurality of pixel electrodes in a planar view; a light emitting layer which is provided so as to cover at least one of the plurality of opening portions; a second layer which is provided on the light emitting layer, and includes a second carrier transport layer or a second carrier injection layer; and a counter electrode which is provided on the second layer.

10 Claims, 16 Drawing Sheets

:
DISPLAY DEVICE

CROSS-REFERENCE TO RELATED APPLICATION

The present application claims priority from Japanese application JP2014-192678 filed on Sep. 22, 2014, the content of which is hereby incorporated by reference into this application.

BACKGROUND OF THE INVENTION

1. Field of the Invention

The present invention relates to a display device, and a manufacturing method of the display device.

2. Description of the Related Art

In a display device such as an organic electro luminescence (EL) display device, there is a case in which pixels including a self-light emitting element such as an organic light emitting diode (OLED) are controlled, and an image is displayed. In the related art, in an organic layer which forms an organic light emitting diode, a hole transport layer (HTL) or a hole injection layer (HIL) is commonly provided with respect to a plurality of pixels.

An EL display device which surrounds the periphery of an anode electrode, has metal wiring which is electrically connected to an organic layer, and in which a potential of the metal wiring is lower than a potential of the anode electrode is disclosed in JP 2012-155953A.

SUMMARY OF THE INVENTION

Since a hole transport layer or a hole injection layer is commonly provided with respect to a plurality of pixels, there is a case in which a leakage current occurs along the hole transport layer, the hole injection layer, or the like, even if a current is caused to flow in order to cause a specific pixel to emit light. There is a case in which a leakage current reaches an adjacent pixel, and causes unintended light emitting of the adjacent pixel.

An object of the invention is to provide a display device in which unintended light emitting of a pixel is prevented.

According to an aspect of the invention, there is provided a display device which includes a plurality of pixel electrodes which are provided separately from each other on an insulative surface; a plurality of first layers which are provided separately from each other on the respective plurality of pixel electrodes, and are at least any one of a plurality of first carrier transport layers and a plurality of first carrier injection layers; a light emitting layer which is provided on the first layer; a second layer which is provided on the light emitting layer, and is at least any one of a second carrier transport layer and a second carrier injection layer; and a counter electrode which is provided on the second layer.

According to another aspect of the invention, there is provided a display device which includes a plurality of pixel electrodes which are provided separately from each other on an insulative surface; a first layer which is provided over the plurality of pixel electrodes, and is at least any one of a first carrier transport layer and a first carrier injection layer; a light emitting layer which is provided on the first layer; a second layer which is provided on the light emitting layer, and is at least any one of a second carrier transport layer and a second carrier injection layer; and a counter electrode which is provided on the second layer, in which the first layer includes an intermediate portion which is provided between the pixel electrodes of two which are adjacent to each other, and a portion in which carrier mobility is higher than that in the intermediate portion is included at a portion which is provided on the pixel electrode in the first layer.

According to still another aspect of the invention, there is provided a manufacturing method of a display device which includes, forming a pixel electrode layer on an insulative surface; forming a common layer which is at least any one of a first carrier transport layer and a first carrier injection layer on the pixel electrode layer; patterning the pixel electrode layer and the common layer; forming a plurality of pixel electrodes which are provided separately from each other; forming a plurality of first layers which are provided separately from each other on the plurality of pixel electrodes, and are at least any one of a plurality of the first carrier transport layers and a plurality of the first carrier injection layers; forming a light emitting layer on the first layer; forming a second layer which is at least any one of a second carrier transport layer and a second carrier injection layer on the light emitting layer; and forming a counter electrode layer on the second layer.

According to still another aspect of the invention, there is provided a manufacturing method of a display device which includes, forming a pixel electrode layer on an insulative surface; patterning the pixel electrode layer; forming a plurality of pixel electrodes which are provided separately from each other; forming a first layer which is at least any one of a first carrier transport layer and a first carrier injection layer over the plurality of pixel electrodes; irradiating a portion which covers the plurality of pixel electrodes in the first layer, or a portion which covers the insulative surface in the first layer with a particle beam or a light beam; forming a light emitting layer on the first layer; forming a second layer which is at least any one of a second carrier transport layer and a second carrier injection layer on the light emitting layer; and forming a counter electrode layer on the second layer.

DETAILED DESCRIPTION OF THE INVENTION

Figure 1:
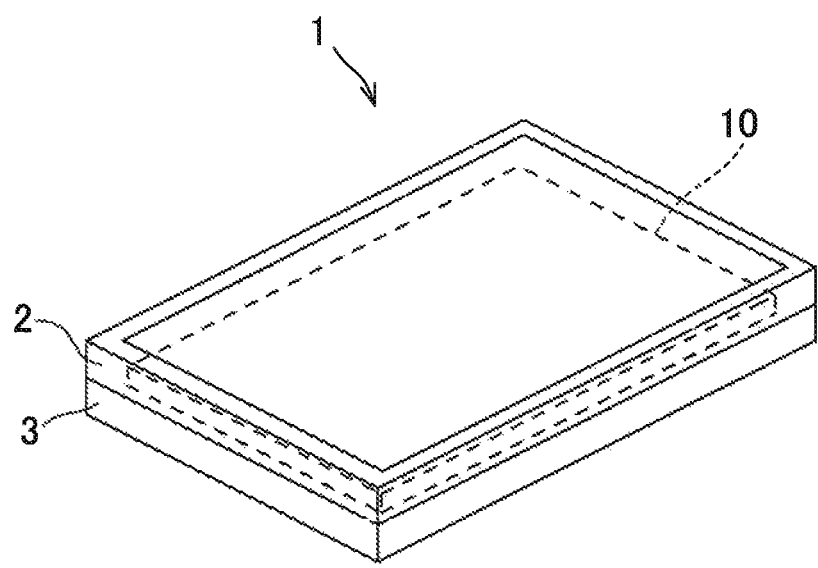
FIG. 1 is a perspective view of an organic EL display device according to an embodiment of the invention.

Hereinafter, each embodiment of the invention will be described with reference to drawings. In addition, disclosed is merely an example, and for a person skilled in the art, an appropriate change which can be easily conceived without departing from the scope of the invention is naturally included in the scope of the invention. In addition, in the drawings, there is a case in which the width, the thickness, a shape, or the like, of each unit is schematically denoted compared to actual forms for further clear descriptions; however, it is merely an example, and does not limit interpretation of the invention. In addition, in the specification and in each drawing, elements which are the same as those in the above described drawings are given the same reference numerals, and detailed descriptions thereof are appropriately omitted.

FIG. 1 is a perspective view which illustrates an organic EL display device 1 according to an embodiment of the invention. The organic EL display device 1 is configured of an organic EL panel 10 which is fixed so as to be interposed between an upper frame 2 and a lower frame 3.

Figure 2:
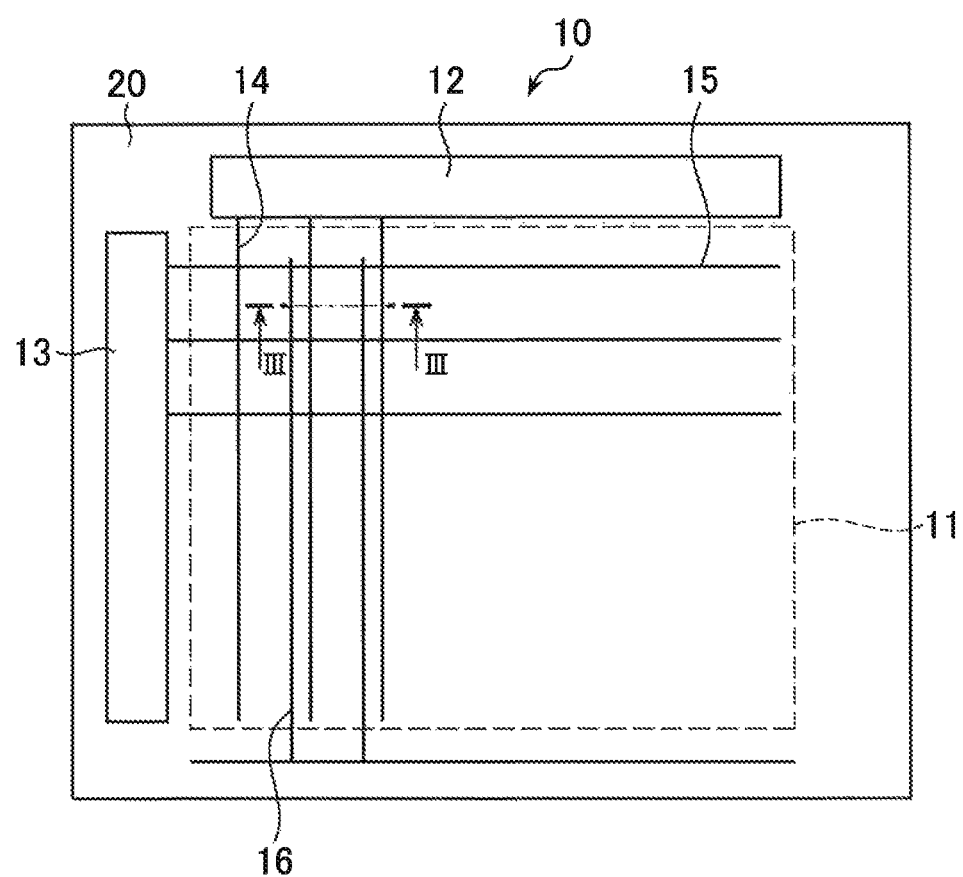
FIG. 2 is a wiring diagram of the organic EL display device according to the embodiment of the invention.

FIG. 2 is a wiring diagram of the organic EL display device 1 according to the embodiment of the invention. The organic EL panel 10 controls each pixel which is provided in a display region 11 in a matrix using an image signal driving circuit 12 and a scanning signal driving circuit 13, and displays an image. Here, the image signal driving circuit 12 is an integrated circuit (IC) which generates an image signal to be sent to each pixel, and transmits the signal. In addition, the scanning signal driving circuit 13 is an IC which generates a scanning signal to be sent to a thin film transistor (TFT) which is provided in the pixel, and transmits the signal. In addition, in the figure, the image signal driving circuit 12 and the scanning signal driving circuit 13 are illustrated as circuits which are formed in two places; however, the circuits may be incorporated in one IC, or may be formed in three or more places by being separated.

A scanning line 15 which transmits a signal from the scanning signal driving circuit 13 is electrically connected to a gate of a pixel transistor which is formed in each pixel region. The scanning line 15 is common to pixel transistors which are aligned in one row. The pixel transistor is a transistor of which a source or a drain is electrically connected to a gate of a driving transistor. The driving transistor is a transistor in which a source is electrically connected to an anode of an organic light emitting diode. A cathode of the organic light emitting diode is fixed to a ground potential. In addition, an image signal line 14 which transmit a signal from the image signal driving circuit 12 is electrically connected to a source or a drain of the pixel transistor. The image signal line 14 is common to pixel transistors which are aligned in one column. When a scanning signal is applied to the scanning line 15, the pixel transistor enters an ON state. In the state, when an image signal is applied to the image signal line 14, the image signal is applied to the gate of the driving transistor, and the driving transistor enters an ON state. A power line 16 is electrically connected to the drain of the driving transistor. A power supply voltage for causing light emission of an organic light emitting diode is applied to the power line 16. When the driving transistor enters an ON state, a current corresponding to the magnitude of the image signal flows in the organic light emitting diode, and the organic light emitting diode emits light.

First Embodiment

Figure 3:
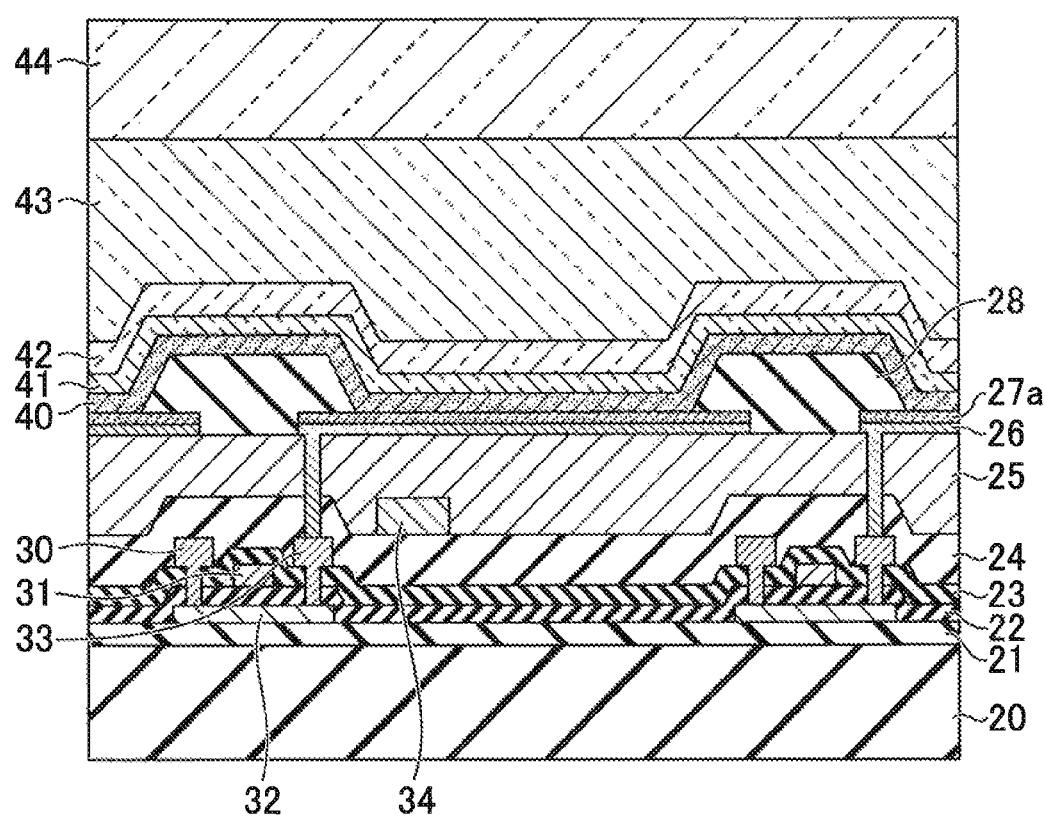
FIG. 3 is a sectional view of a pixel of an organic EL panel according to a first embodiment.

FIG. 3 is a sectional view of a pixel of the organic EL panel 10 according to a first embodiment of the invention. FIG. 3 is a sectional view which is taken along line III-III in FIG. 2. A substrate 20 is arranged on the lowermost layer of the organic EL panel 10. The substrate 20 is formed using glass, an artificial resin, or the like.

A base film 21 is formed using SiN, $SiO_2$, or the like, on the substrate 20. A channel layer 32 which electrically connects a drain electrode 30 and a source electrode 33 of the driving transistor is formed on the base film 21. The channel layer 32 is formed using polycrystalline silicon. In addition, the channel layer 32 may be formed using amorphous silicon, or the like. A first insulating film 22 is formed on the base film 21 and the channel layer 32 using SiN, $SiO_2$, or the like. A gate electrode 31 of the driving transistor is formed on the first insulating film 22 using a metal material. A second insulating film 23 is formed on the first insulating film 22 and the gate electrode 31 using SiN, $SiO_2$, or the like. A through hole which reaches the channel layer 32 is provided in the second insulating film 23 and the first insulating film 22, and the drain electrode 30 and the source electrode 33 of the driving transistor is formed using a metal material. An interlayer insulating film 24 is formed on the drain electrode 30, the source electrode 33, and the second insulating film 23 using SiN, $SiO_2$, or the like. Wiring 34 is formed on the interlayer insulating film 24 using a metal material. The wiring 34 is the power line 16, the image signal line 14, or the like. A planarization film 25 is formed on the wiring 34 and the interlayer insulating film 24 using SiN, $SiO_2$, or the like. In addition, in the example which is illustrated in FIG. 3, the channel layer 32 is an n channel, and a current flows to the source electrode 33 side from the drain electrode 30 side.

The surface of the planarization film 25 is the insulative surface. A pixel electrode 26 is formed on the planarization film 25 which is the insulative surface using a metal material. The pixel electrode 26 becomes an anode of the organic light emitting diode. The pixel electrode 26 is electrically connected to the source electrode 33 of the driving transistor through a through hole which is provided in the planarization film 25 and the interlayer insulating film 24. The pixel electrode 26 is separately formed from each other in each pixel. In the organic EL display device 1, a corresponding pixel is caused to emit light by applying a voltage to a specific pixel electrode 26, and an image is displayed. However, as described above, when the organic layer which is stacked on the pixel electrode 26 is formed over the plurality of pixels, there is a case in which a leakage current occurs along the organic layer, and an adjacent pixel emits light. Here, in many case, the leakage current occurs through a layer which is formed on the pixel electrode 26 side in the organic layer.

In the organic EL panel 10 according to the first embodiment, at least any one (first layer) of a plurality of carrier transport layers and a plurality of carrier injection layers are formed on the respective plurality of pixel electrodes 26. Here, a carrier means an electron or a hole. According to the embodiment, the carrier transport layer is a hole transport layer 27a. A plurality of the hole transport layers 27a are provided separated from each other. In addition, a layer which is provided on the pixel electrode 26 may be a hole injection layer. In addition, a layer which is provided on the pixel electrode 26 may be a layer in which the hole injection layer and the hole transport layer are stacked in order from the pixel electrode 26 side. The hole transport layer 27a is formed using, for example, poly(3,4-ethylenedioxythiophene)-poly(styrenesulphonic acid) (PEDOD-PSS); however, the hole transport layer may be formed using a conductive organic material other than that. As in the embodiment, a leakage current through the hole transport layer 27a is not generated by separately forming the hole transport layer 27a in each of the plurality of pixel electrodes 26. For this reason, it is possible to prevent unintended light emitting of a pixel.

In addition, the pixel electrode 26 and the hole transport layer 27a may be formed using etching. In the related art, there is a case in which the hole transport layer 27a is formed by being patterned using a deposition process in which a deposition mask is used. It is possible to make the patterning of the hole transport layer 27a more simple by patterning the hole transport layer 27a using etching before forming a pixel separation film 28 as in the embodiment. In addition, there is a concern that fine machining may become difficult in the deposition process, and a deposition layer may be contaminated due to a substance which is attached to the deposition mask in the previous process. In that point, in the embodiment, it is possible to pattern the hole transport layer 27a with high accuracy while preventing contamination using photolithography and etching. In addition, when the pixel electrode 26 and the hole transport layer 27a are formed using etching, it is possible to use wet etching. In addition, dry etching may also be used.

The pixel separation film 28 is formed on the planarization film 25, the pixel electrode 26, and the hole transport layer 27a using a photosensitive resin such as acryl, and polyimide, or an inorganic material such as SiN and $SiO_2$. The pixel separation film 28 covers end portions of the pixel electrode 26 and the hole transport layer 27a, and prevents short circuiting between electrodes. In addition, the pixel separation film 28 defines a light emitting region as described below.

An organic layer 40 is formed on a plurality of the pixel separation films 28 and the plurality of hole transport layers 27a. The organic layer 40 is a layer which is formed by stacking a light emitting layer and an electron transport layer (ETL) in order from the hole transport layer 27a side. Here, an electron injection layer (EIL) may be formed, or the electron transport layer and the electron injection layer may be formed in order on the light emitting layer. A light emitting region of the light emitting layer is a portion which is formed on the hole transport layer 27a in the light emitting layer (portion not formed on pixel separation film 28 in the light emitting layer). A hole flows in from the hole transport layer 27a in the light emitting region of the light emitting layer, and an electron flows in from the electron transport layer in the light emitting region of the light emitting layer. In addition, in the light emitting layer, merging of the electron and the hole is performed, the organic material which forms the light emitting layer is excited, and light is emitted when transition from a high energy level to a low energy level is performed.

The organic EL diode which is configured of the hole transport layer 27a and the organic layer 40 may be a so-called tandem type. That is, a first organic EL diode is formed by stacking the hole transport layer 27a, the first light emitting layer, the electron transport layer in order, and a charge generation layer may be formed on the electron transport layer. A second organic EL diode may be formed on the charge generation layer by stacking the hole transport layer, a second light emitting layer, and the electron transport layer in order. In addition, a third organic EL diode may be formed when the charge generation layer is stacked, and the hole transport layer, a third light emitting layer, and the electron transport layer are stacked in order. It is possible to set luminous color of the tandem-type organic light emitting diode to a white color as a whole, by adjusting the luminous color of the plurality of organic light emitting diodes which are stacked. In that case, a full color image display is performed by providing a color filter which will be described later. When the luminous color of the organic light emitting diode is set to a white color, and a full color display is performed using the color filter, the organic layer 40 may be formed on the entire face of the display region 11 using deposition, or the like, and it is not necessary to form the organic layer in each pixel by separating the organic layer. When the organic layer 40 is formed in the entire face of the display region 11, it is not necessary to pattern the organic layer 40 using a deposition mask, or the like, and it is possible to inexpensively form the organic layer 40.

A counter electrode 41 is formed on the organic layer 40 using a transparent conductive material such as Indium Tin Oxide (ITO). The counter electrode 41 is a cathode of the organic light emitting diode. A sealing film 42 is formed on the counter electrode 41 so as to prevent deterioration of the organic layer. In addition, a filler 43 is filled, and is sealed when a counter substrate 44 is bonded. A black matrix, a color filter, and a polarizing plate may be formed on the front surface or the rear surface of the counter substrate 44. In addition, a touch panel may be provided on the front surface of the counter substrate 44.

Figure 4:
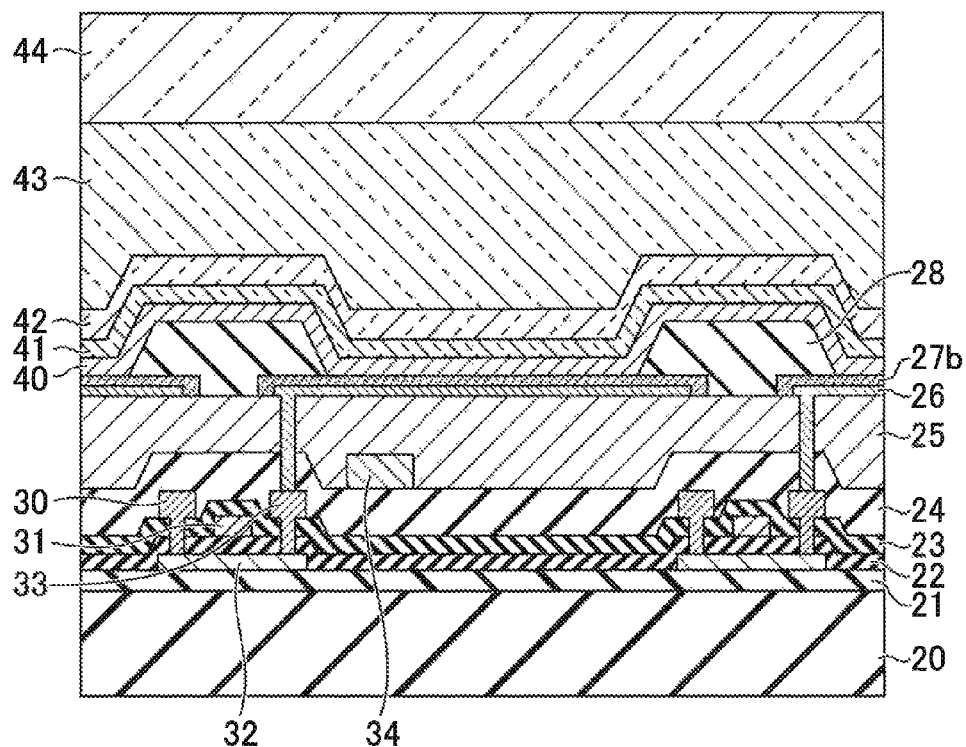
FIG. 4 is a sectional view of a pixel of an organic EL panel according to a first modification example.

FIG. 4 is a sectional view of a pixel of an organic EL panel 10 according to a first modification example. A difference between the organic EL panel 10 according to the first modification example and the organic EL panel 10 according to the first embodiment is that a plurality of hole transport layers 27b are provided over a planarization film 25 which has the insulative surface from a pixel electrode 26. That is, the hole transport layer 27b is formed so as to be larger than the pixel electrode 26, and is formed so as to cover an end portion of the pixel electrode 26. The organic EL panel 10 according to the first embodiment and the organic EL panel 10 in the first modification example have the same configuration other than that.

When the hole transport layer 27b is provided over the planarization film 25 from the pixel electrode 26, it is possible to form the pixel electrode 26 and the hole transport layer 27b using a different etching process. For this reason, it is possible to change etching conditions for forming the pixel electrode 26 and etching conditions for forming the hole transport layer 27b, and to set appropriate etching conditions depending on respective materials.

Figure 5:
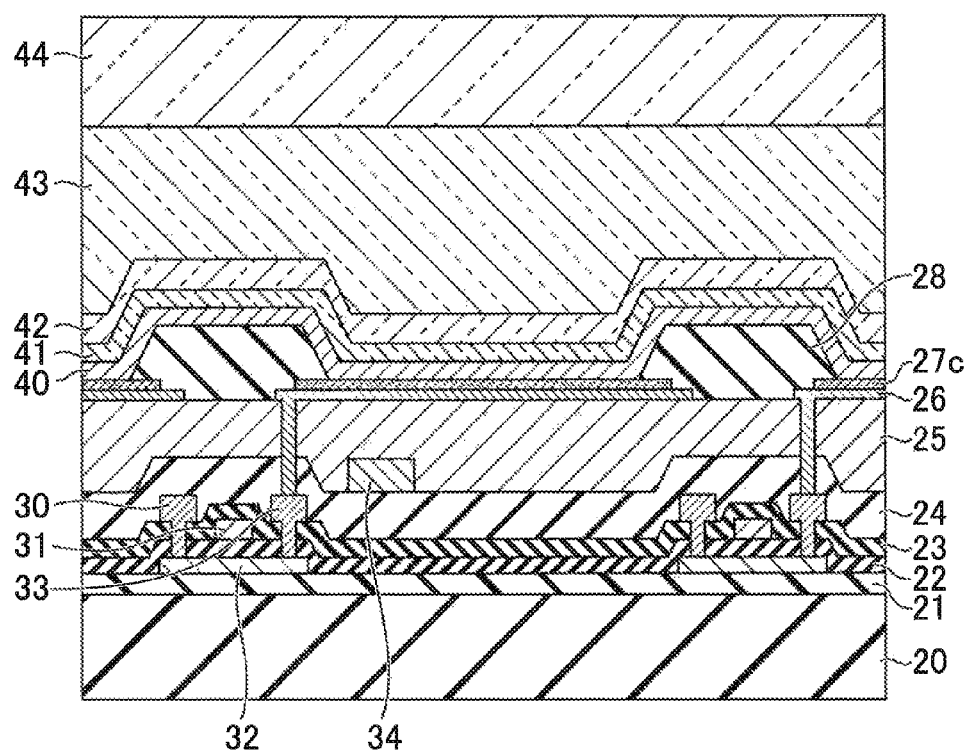
FIG. 5 is a sectional view of a pixel of an organic EL panel according to a second modification example.

FIG. 5 is a sectional view of a pixel of an organic EL panel 10 according to a second modification example. A difference between the organic EL panel 10 according to the second modification example and the organic EL panel 10 according to the first embodiment is that the respective end portions of a plurality of hole transport layers 27c are provided on a pixel electrode 26. That is, the hole transport layer 27c is formed so as to be smaller than the pixel electrode 26, and an end portion of the pixel electrode 26 is not covered by the hole transport layer 27c. The organic EL panel 10 according to the first embodiment and the organic EL panel 10 in the second modification example have the same configuration other than that.

When an end portion of the hole transport layer 27c is provided on the pixel electrode 26, it is possible to form the pixel electrode 26 and the hole transport layer 27c using a different etching process. For this reason, it is possible to change etching conditions for forming the pixel electrode and etching conditions for forming the hole transport layer 27c, and to set appropriate etching conditions depending on respective materials. In addition, it is possible to pattern the pixel electrode 26 and the hole transport layer 27c at the same time using one etching process. In that case, by using an etching solution with a high etching rate with respect to the hole transport layer 27c rather than the pixel electrode 26, a configuration of the example is realized.

Figure 6:
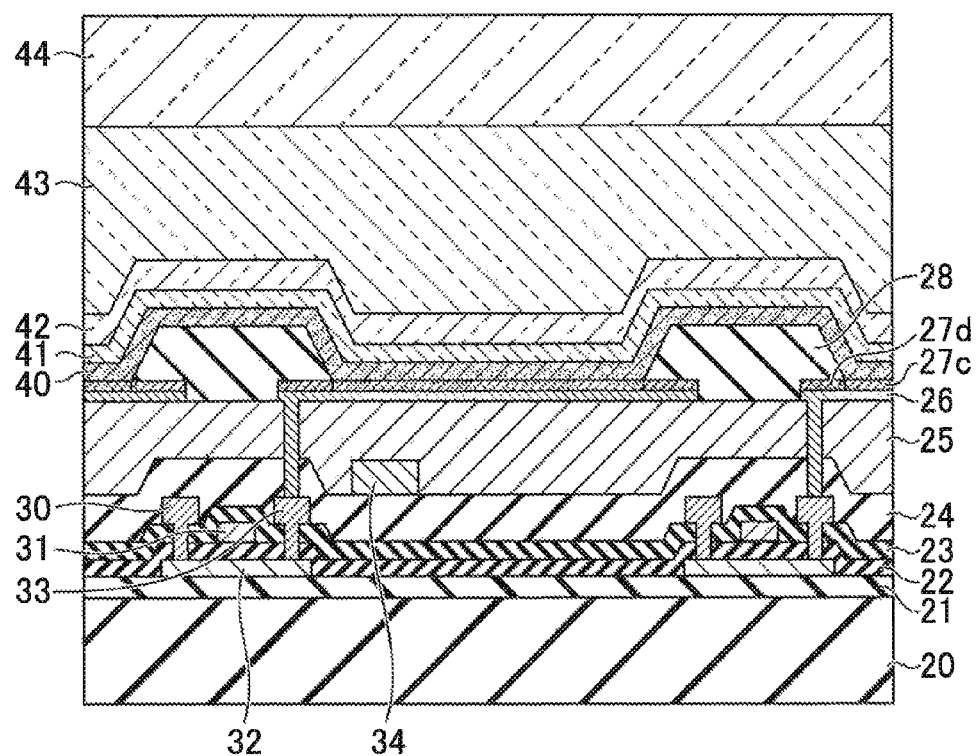
FIG. 6 is a sectional view of a pixel of an organic EL panel according to a third modification example.

FIG. 6 is a sectional view of a pixel of an organic EL panel 10 according to a third modification example. A difference between the organic EL panel 10 according to the third modification example and the organic EL panel 10 according to the first embodiment is that carrier mobility of a plurality of hole transport layers 27d is lower than carrier mobility of a plurality of a hole transport layers 27c which is a portion other than the end portion of the hole transport layer. In the example, carrier mobility is hole mobility. In the third modification example, hole mobility at a portion which is covered by the pixel separation film 28 in the hole transport layer 27 is lower than hole mobility of a portion which is not covered by the pixel separation film 28 in the hole transport layer 27. The organic EL panel 10 according to the first embodiment and the organic EL panel 10 in the third modification example have the same configuration other than that.

A difference in hole mobility between the end portion 27d and the portion 27c other than the end portion in the hole transport layer can be caused by injecting nitrogen ion or hydrogen ion to the portion 27c other than the end portion in the hole transport layer. In the portion 27c in the hole transport layer other than the end portion to which nitrogen ion with an appropriate concentration is injected, a hole injection property is improved, and the hole mobility increases. For this reason, a current is constricted at the portion 27c other than the end portion in the hole transport layer, and it is possible to more efficiently supply the current to the light emitting layer. It is possible to use the pixel separation film 28 as a mask by performing an ion injecting process after forming the pixel separation film 28, and to simply perform the process by omitting a mask forming process, or the like. In addition, a difference in hole mobility between the end portion 27d and the portion 27c other than the end portion in the hole transport layer may be caused using electron beam irradiation, infrared light irradiation, ultraviolet light irradiation, or the like, in addition to injection of ion.

Second Embodiment

Figure 7:
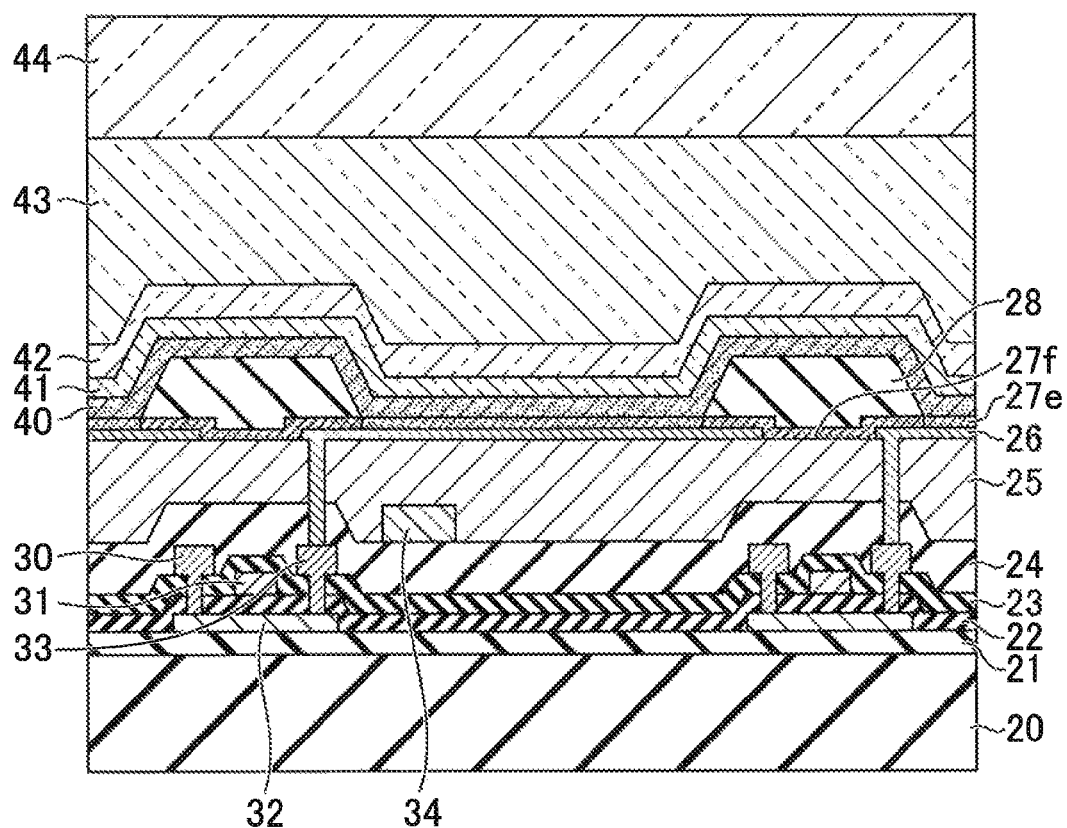
FIG. 7 is a sectional view of a pixel of an organic EL panel according to a second embodiment.

FIG. 7 is a sectional view of a pixel of an organic EL panel 10 according to a second embodiment. A difference between the organic EL panel 10 according to the second embodiment and the organic EL panel 10 according to the first embodiment is that the hole transport layer 27 is provided over the plurality of pixel electrodes 26, the hole transport layer 27 has an intermediate portion 27f (hereinafter, referred to as intermediate portion 27f) which is provided between adjacent two pixel electrodes 26, and a portion in which carrier mobility is higher than that in the intermediate portion 27f is included at a portion 27e which is provided on the pixel electrode 26 in the hole transport layer 27 (hereinafter, referred to as center portion 27e of hole transport layer). Here, when the hole transport layer 27 is provided over the plurality of pixel electrodes 26, it means that the hole transport layer 27 is continuously provided on the plurality of pixel electrodes 26 in one united body. According to the embodiment, the pixel separation film 28 is provided so as to cover the intermediate portion 27f of the hole transport layer. Hole mobility at a portion in the hole transport layer 27 which is not covered by the pixel separation film 28 is higher than hole mobility at a portion in the hole transport layer 27 which is covered by the pixel separation film 28. In configurations other than those, the organic EL panel 10 according to the first embodiment and the organic EL panel 10 according to the second embodiment have the same configurations.

A difference in hole mobility between the center portion 27e of the hole transport layer and the intermediate portion 27f of the hole transport layer can be caused by injecting nitrogen ion, hydrogen ion, or the like, to the center portion 27e of the hole transport layer. It is possible to use the pixel separation film 28 as a mask by performing an ion injecting process after forming the pixel separation film 28, and to simply perform the process by omitting a mask forming process, or the like. In addition, a difference in hole mobility between the center portion 27e of the hole transport layer and the intermediate portion 27f of the hole transport layer may be caused using electron beam irradiation, infrared light irradiation, ultraviolet light irradiation, or the like, in addition to injection of ion.

According to the embodiment, the hole transport layer is formed over the plurality of pixels. However, an occurrence of a leakage current in an adjacent pixel is suppressed since the hole mobility of the intermediate portion 27f of the hole transport layer is relatively low. It is also possible to prevent unintended light emitting of a pixel when such a configuration is adopted.

Third Embodiment

Figure 8:
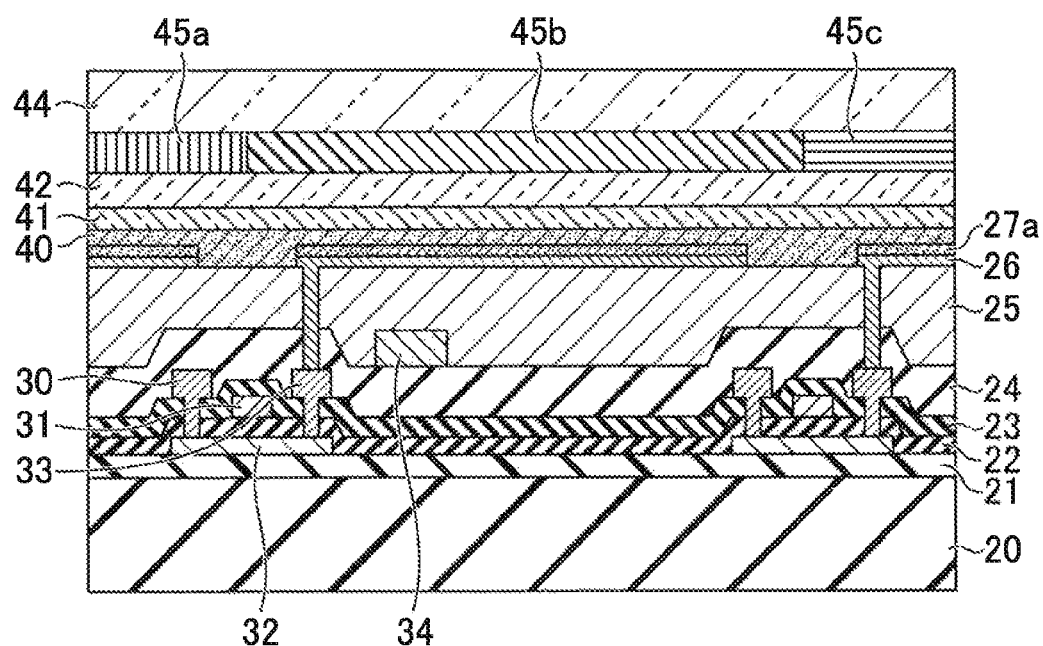
FIG. 8 is a sectional view of a pixel of an organic EL panel according to a third embodiment.

FIG. 8 is a sectional view of a pixel of an organic EL panel 10 according to a third embodiment. In the third embodiment, a configuration in the layers lower than a hole transport layer 27a, a pixel electrode 26, and a planarization film 25 is the same as that in the first embodiment. A plurality of the pixel electrodes 26 are provided by being separated from each other, and the hole transport layers 27a are provided on the respective plurality of pixel electrodes 26 by being separated from each other. For this reason, in the organic EL panel 10 according to the embodiment, a leakage current through the hole transport layer 27a does not occur, and unintended light emitting of a pixel is prevented. The organic EL panel 10 according to the embodiment does not have the pixel separation film 28, and an organic layer 40 is planarly formed on the plurality of hole transport layers 27a and the planarization film 25. According to the embodiment, a light emitting region of the organic layer 40 is a portion which covers the hole transport layer 27a in the organic layer 40.

In the embodiment, a color filter 45 is formed on the sealing film 42. A counter substrate 44 is formed on the color filter 45, and is sealed. The color filter 45 is configured of a red color filter 45*a*, a green color filter 45*b*, and a blue color filter 45*c*. A color filter of each color is provided so as to be located on the upper part of a specific pixel electrode 26, respectively. That is, a color filter of each color is provided so as to be located on any upper part in a plurality of light emitting regions included in the organic layer 40. Light which is generated in the light emitting region of the organic layer is viewed as green light by passing through the green color filter 45*b*, for example. In addition, though it is not illustrated, a black matrix structure for light shielding which is arranged so as to cover a non-light emitting region may be provided at respective border portions of the color filters.

The organic EL panel 10 according to the embodiment becomes thin compared to an organic EL panel which includes a pixel separation film 28, since the panel does not include the pixel separation film 28, and can be manufactured at low cost, since there is no process for forming a pixel separation film. In addition, in the organic EL panel 10 according to the embodiment, light which leaks to an adjacent pixel is reduced compared to an organic EL panel which includes the pixel separation film 28, since a distance between the light emitting region of the organic layer 40 and the color filter becomes closer. For this reason, it is possible to further suppress mixture of colors with an adjacent pixel which is caused by light which leaks to the adjacent pixel.

Fourth Embodiment

Figure 9:
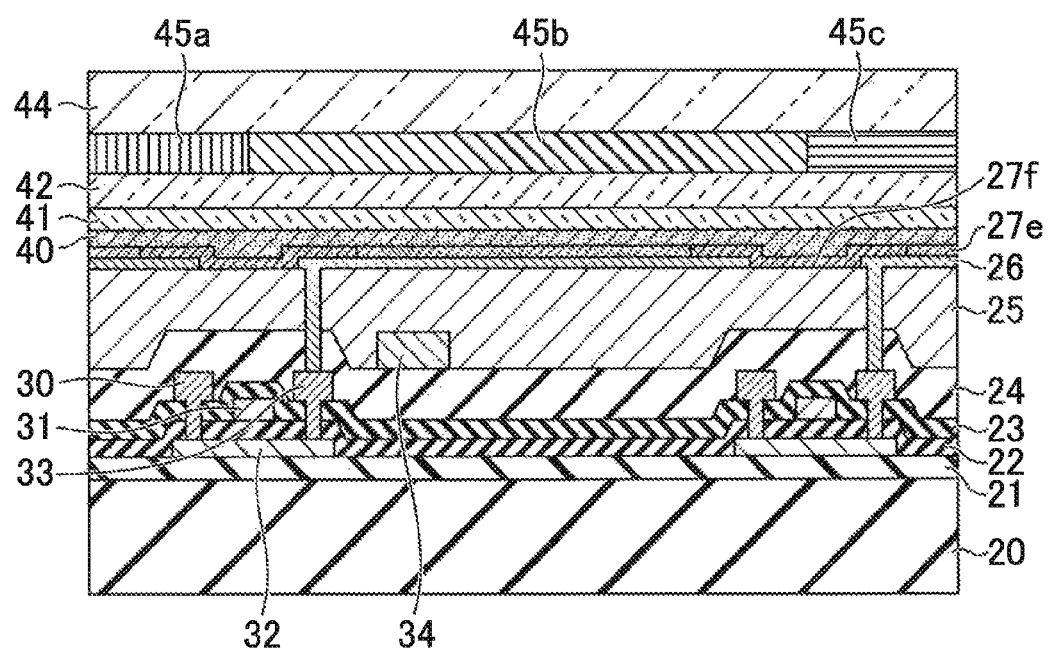
FIG. 9 is a sectional view of a pixel of an organic EL panel according to a fourth embodiment.

FIG. 9 is a sectional view of a pixel of an organic EL panel 10 according to a fourth embodiment. In the fourth embodiment, a configuration in the layers lower than a hole transport layer 27, a pixel electrode 26, and a planarization film 25 is the same as that in the third modification example. A plurality of the pixel electrodes 26 are provided by being separated from each other. The hole transport layer 27 is provided over the plurality of pixel electrodes 26, and hole mobility at a center portion 27*e* in the hole transport layer is higher than hole mobility at an intermediate portion 27*f* of the hole transport layer. In other words, the hole transport layer 27 is continuously provided on the plurality of pixel electrodes 26 in one united body, and hole mobility at the center portion 27*e* of the hole transport layer is higher than hole mobility of the intermediate portion 27*f* of the hole transport layer. For this reason, in the organic EL panel 10 according to the embodiment, a leakage current through the hole transport layer 27 does not occur, and it is possible to prevent unintended light emitting of a pixel. The organic EL panel 10 according to the embodiment does not include the pixel separation film 28, and an organic layer 40 is planarly formed on the hole transport layer 27. In the embodiment, a light emitting region of the organic layer 40 is a portion which covers the center portion 27*e* of the hole transport layer in the organic layer 40.

The organic EL panel 10 according to the embodiment becomes thin compared to an organic EL panel which includes the pixel separation film 28, since the panel does not include the pixel separation film 28. In addition, in the organic EL panel 10 according to the embodiment, light which leaks to an adjacent pixel is reduced compared to the organic EL panel which includes the pixel separation film 28, since a distance between the light emitting region of the organic layer 40 and the color filter becomes closer. For this reason, it is possible to further suppress mixture of colors with an adjacent pixel which is caused by light which leaks to the adjacent pixel.

Figure 10:
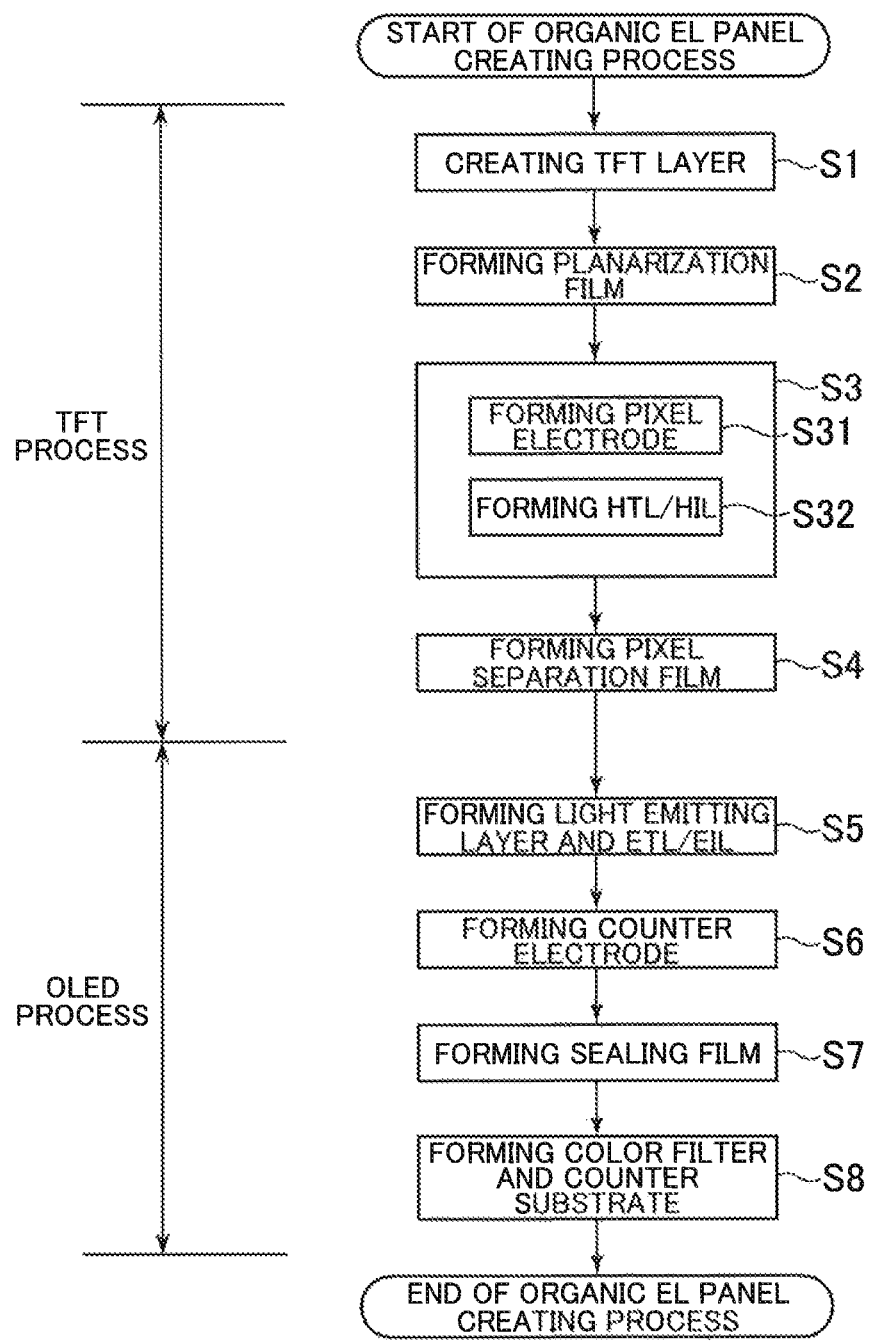
FIG. 10 is a flowchart of an organic EL panel creating process according to the embodiment.

FIG. 10 is a flowchart which illustrates a creating process of the organic EL panel 10 according to the embodiment. The creating process of the organic EL panel 10 starts from the formation of a TFT layer (S1). Here, the TFT layer is a layer which includes a substrate 20, an interlayer insulating film 24, and a TFT which is provided therebetween. The formation of the TFT layer ends when wiring 34 is formed on the interlayer insulating film 24.

Subsequently, the planarization film 25 is formed on the interlayer insulating film 24 and the wiring 34 (S2). Thereafter, a formation of a substructure including a formation of the pixel electrode 26 (S31), and a formation of the hole transport layer 27 (hole injection layer, or hole transport layer and hole injection layer) (S32) is performed. The formation of the substructure (S3) will be described in detail using FIGS. 11 to 16.

Thereafter, formation of the pixel separation film 28 is performed (S4). In addition, as in the third and fourth embodiments, in a creating process of an organic EL panel 10 which does not include the pixel separation film 28, the formation of the pixel separation film 28 (S4) is not performed.

In the specification, the above described process is referred to as a TFT process. That is, in the creating process of the organic EL panel 10, processes from the formation of the TFT layer (S1) to the formation of the pixel separation film 28 (S4) is referred to as the TFT process. In addition, in the specification, remaining processes which are performed after the TFT process in the creating process of the organic EL panel 10 are referred to as an OLED process. There is a case in which the TFT process is performed by raising an ambient temperature to approximately several hundred degrees Celsius. On the other hand, there is a case in which the OLED process is performed by suppressing the ambient temperature to approximately tens of degrees Celsius in order to prevent deterioration of the light emitting layer. For this reason, it is necessary to perform the OLED process under circumstances which are more reliably controlled compared to the TFT process. In that point, in the creating process of the organic EL panel 10 according to the embodiment, it is possible to reduce a formation process of the organic layer 40 in the OLED process, and to reduce the OLED process as a whole, since the hole transport layer 27 is formed in the TFT process. For this reason, it is possible to reduce a process which needs a high-degree control, and to perform the creating process of the organic EL panel 10 at a low cost and in a short time.

After performing the TFT process, the organic layer 40, that is, the light emitting layer and the electron transport layer (electron injection layer, or electron transport layer and electron injection layer) are formed (S5). Thereafter, the counter electrode 41 is formed (S6), and the sealing film 42 is formed (S7). In addition, a color filter 51 and the counter substrate 44 are bonded or stacked (S8), and the creating process of the organic EL panel 10 ends. The created organic EL panel 10 is fixed so as to be interposed between the upper frame 2 and the lower frame 3, and becomes the organic EL display device 1.

Figure 11:
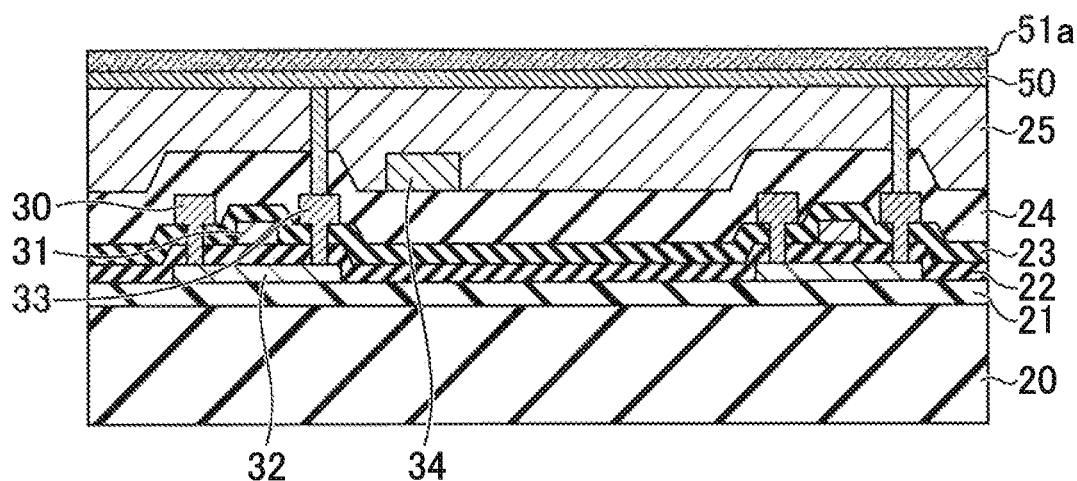
FIG. 11 is a diagram which illustrates a pixel electrode layer and a common layer in a first example of a substructure forming process.

FIG. 11 is diagram which illustrates a pixel electrode layer 50 and a common layer 51*a* in a first example of the substructure forming process (S3). In the first example, first, the pixel electrode layer 50 is formed in the substructure forming process (S3). The pixel electrode layer 50 may be provided over the entire face of the planarization film 25.

Subsequently, the common layer 51a as the hole transport layer is formed on the pixel electrode layer 50. In addition, the common layer 51a may be a hole injection layer, or may be a hole injection layer and a hole transport layer.

Figure 12:
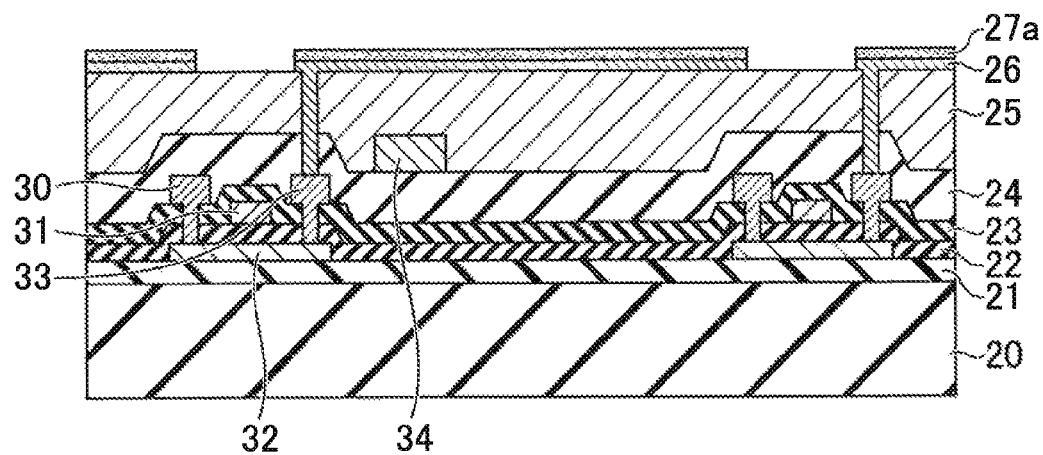
FIG. 12 is a diagram which illustrates a pixel electrode and a hole transport layer in the first example of the substructure forming process.

FIG. 12 is a diagram which illustrates the pixel electrode 26 and the hole transport layer 27a in the first example of the substructure forming process (S3). In the first example, the pixel electrode 26 and the hole transport layer 27a are patterned at the same time using photolithography and etching after forming the pixel electrode layer 50 and the common layer 51a. In this manner, the plurality of pixel electrodes 26 which are provided by being separated from each other, and the plurality of hole transport layers 27a which are provided on the respective plurality of pixel electrodes 26 by being separated from each other are formed using one etching process. In the first example, since the pixel electrode 26 and the hole transport layer 27a are formed in one etching process, it is possible to perform the substructure forming process (S3) in a relatively short time and inexpensively.

Figure 13:
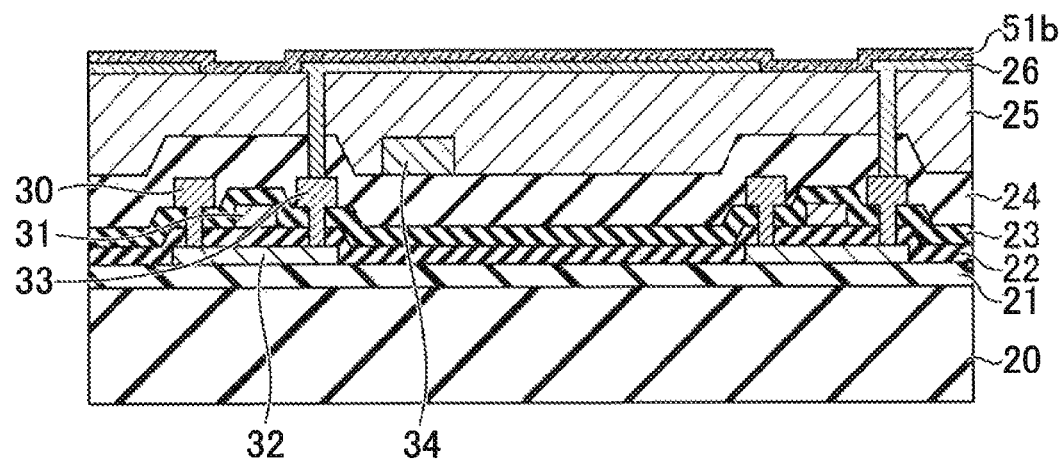
FIG. 13 is a diagram which illustrates a pixel electrode and a common layer in a second example of the substructure forming process.

FIG. 13 is a diagram which illustrates the pixel electrode 26 and a common layer 51b in a second example of the substructure forming process (S3). In the second example, first, the plurality of pixel electrodes 26 which are separated from each other are formed in the substructure forming process (S3). Here, the plurality of pixel electrodes are formed by patterning the pixel electrode layer 50 which is formed on the entire face of the planarization film 25 using photolithography or etching. Subsequently, the common layer 51b which is the hole transport layer is formed over the plurality of pixel electrodes 26. The common layer 51b is also formed on the planarization film 25, in addition to the plurality of pixel electrodes 26 thereon. In addition, the common layer 51b may be a hole injection layer, or may be a hole injection layer and a hole transport layer.

Figure 14:
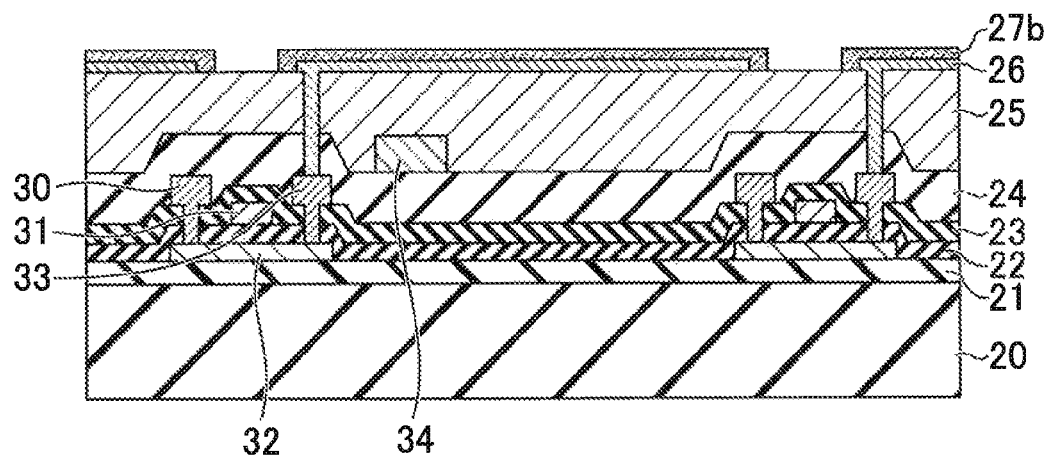
FIG. 14 is a diagram which illustrates the pixel electrode and a hole transport layer in the second example of the substructure forming process.

FIG. 14 is a diagram which illustrates the pixel electrode 26 and the hole transport layer 27b in the second example of the substructure forming process (S3). In the second example, the plurality of hole transport layer 27b are patterned using photolithography or etching after forming the pixel electrode 26 and the common layer 51b. In the second example, the etching process for forming the pixel electrode 26, and the etching process for forming the hole transport layer 27b become different. For this reason, it is possible to change etching conditions for forming the pixel electrode 26 and etching conditions for forming the hole transport layer 27b, and to set appropriate etching conditions depending on respective materials.

The hole transport layer 27b which is formed in the second example has a configuration corresponding to the first modification example illustrated in FIG. 4. That is, the hole transport layer 27b is provided over the planarization film from the pixel electrode 26 thereon. As a matter of course, in the process of forming the plurality of hole transport layer 27b in the second example of the substructure forming process (S3), it is also possible to create a configuration corresponding to the second modification example illustrated in FIG. 5 by changing the shape of a photoresist.

Figure 15:
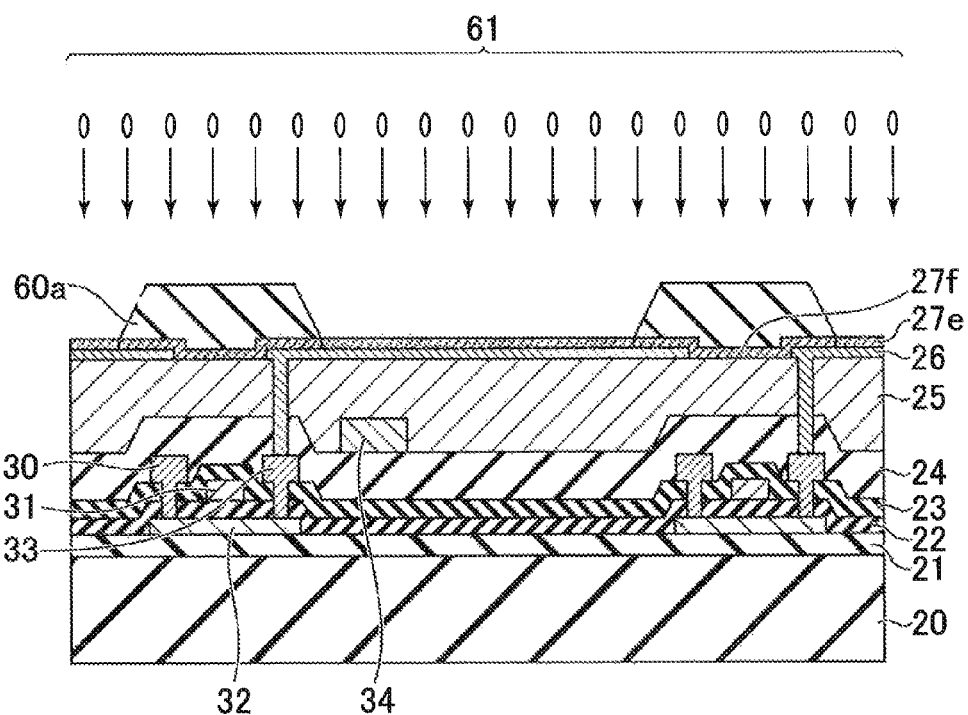
FIG. 15 is a diagram which illustrates irradiation of a particle beam in a third example of the substructure forming process.

FIG. 15 is a diagram which illustrates irradiation of a particle beam 61 in a third example of the substructure forming process (S3). In the third example, a photoresist 60a is formed after forming the plurality of pixel electrodes 26 and the common layer 51b. The photoresist 60a is formed so as to cover the intermediate portion 27f of the hole transport layer, and an end portion of a portion which covers the pixel electrode in the hole transport layer. That is, the photoresist 60a is formed so as to expose the center portion 27e of the hole transport layer. In the third example, irradiation of the particle beam 61 such as nitrogen ion, or hydrogen ion is performed in a state in which the photoresist 60a is formed. At a portion of the hole transport layer which is irradiated with the particle beam 61 at an appropriate particle concentration, hole mobility is improved. For this reason, hole mobility of the center portion 27e of the hole transport layer is higher than that of the intermediate portion 27f of the hole transport layer. In addition, the particle beam 61 may be an electron, or the like, in addition to ion. In addition, irradiation of a light beam such as infrared light or ultraviolet light may be performed instead of irradiation of the particle beam 61.

The hole transport layer 27 which is created in the third example has a configuration corresponding to the second embodiment which is illustrated in FIG. 7, and the fourth embodiment which is illustrated in FIG. 9. That is, the hole transport layer 27 is provided over the plurality of pixel electrodes 26 thereon, and hole mobility of the center portion 27e of the hole transport layer is higher than hole mobility of the intermediate portion 27f of the hole transport layer.

Figure 16:
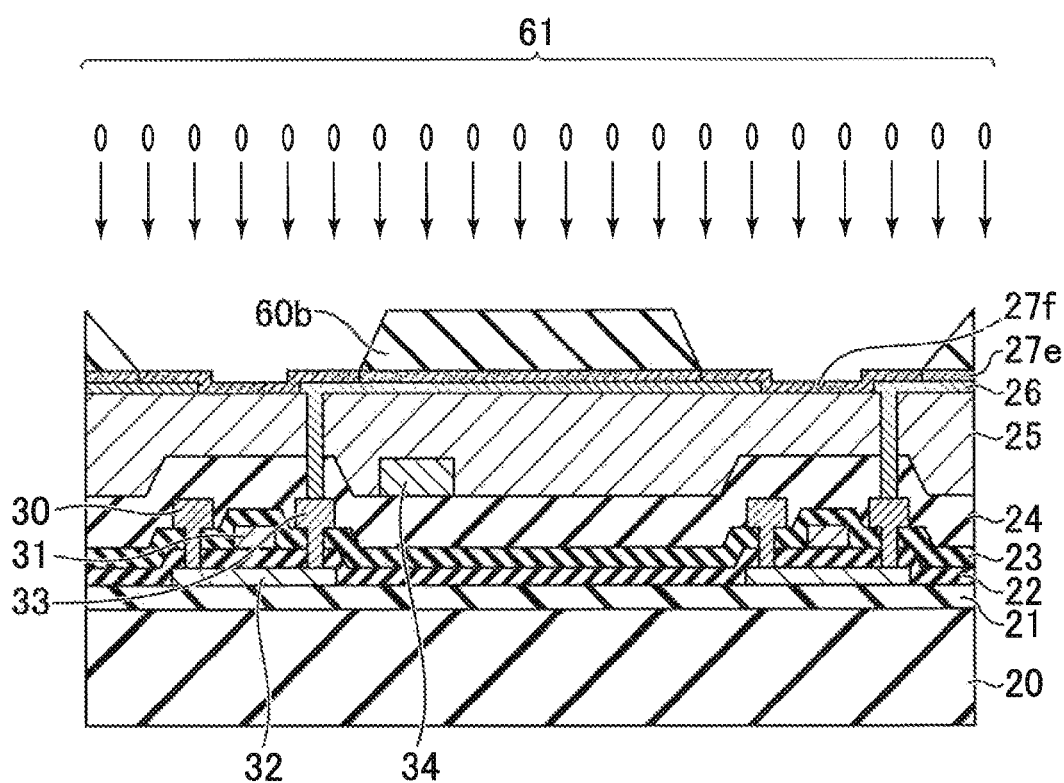
FIG. 16 is a diagram which illustrates irradiation of a particle beam in a fourth example of the substructure forming process.

FIG. 16 is a diagram which illustrates irradiation of the particle beam 61 in a fourth example of the substructure forming process (S3). In the fourth example, a photoresist 60b is formed after forming the pixel electrode 26 and the common layer 51b. The photoresist 60b is formed so as to cover the center portion 27e of the hole transport layer. That is, the photoresist 60b is formed so as to expose the intermediate portion 27f of the hole transport layer, and an end portion at a portion which covers the pixel electrode 26 in the hole transport layer. In the fourth example, irradiation of the particle beam 61 such as nitrogen ion, hydrogen ion, or the like, is performed in a state in which the photoresist 60b is formed. Here, the particle beam 61 which is radiated in the fourth example has a high particle concentration compared to the particle beam which is radiated in the third example, and deteriorates hole mobility by damaging an irradiated portion. For this reason, hole mobility of the center portion 27e of the hole transport layer becomes higher than hole mobility of the intermediate portion 27f of the hole transport layer. In addition, the particle beam 61 may be an electron, or the like, in addition to ion, and irradiation of a light beam such as infrared light or ultraviolet light may be performed instead of irradiation of the particle beam 61.

The hole transport layer 27 which is created in the fourth example has a configuration corresponding to the second embodiment which is illustrated in FIG. 7, and the fourth embodiment which is illustrated in FIG. 9 similar to the hole transport layer 27 which is created in the third example. That is, the hole transport layer 27 is provided on the plurality of pixel electrodes 26, and hole mobility of the center portion 27e of the hole transport layer is higher than hole mobility of the intermediate portion 27f of the hole transport layer.

In the above descriptions, the pixel electrode 26 is the anode of the organic light emitting diode, and the counter electrode 41 is the cathode of the organic light emitting diode. However, it may be a configuration in which the pixel electrode 26 is the cathode of the organic light emitting diode, and the counter electrode 41 is the anode of the organic light emitting diode. In that case, an electron transport layer (electron injection layer, or electron injection layer and electron transport layer) is formed on the pixel electrode 26. In addition, the light emitting layer is formed on the electron transport layer, and the hole transport layer is formed on the light emitting layer. The counter electrode 41 is formed on the hole transport layer. When such a configuration is adopted, the electron transport layers are formed on the respective plurality of pixel electrodes 26 by being separated from each other. Since a leakage current toward an adjacent pixel is generated through a layer which is formed on the pixel electrode 26 side, in the organic layer, in many cases, an occurrence of the leakage current can be prevented also in a case in which the electron transport layers are formed on the respective plurality of pixel electrodes 26 by being separated from each other. For this reason, unintended light emitting of a pixel is prevented.

All of organic EL display devices of which designs are appropriately changed and executed by a person skilled in the art based on the above described organic EL display device 1 as the embodiment of the invention are also included in the scope of the invention as long as they include the gist of the invention. In addition, a display device other than the organic EL display device, for example, a quantum dot display device, or the like, which adopts a quantum dot element as a light emitting layer is also included in the scope of the invention.

In a category of the thought of the invention, a person skilled in the art can perceive various modification examples, and it is understood that the modification examples are also included in the scope of the invention. For example, technologies in which an appropriate addition and deletion of a constituent element, or a change in design are performed by a person skilled in the art, with respect to the above described each embodiment, or technologies in which an addition and omission of a process, or a change in conditions are performed are also included in the scope of the invention as long as they include the gist of the invention.

In addition, other operational effects which are caused by the descriptions in the embodiment are also understood as effects which are caused by the invention, as a matter of course, when they are obvious in descriptions of the specification, or can be appropriately perceived by a person skilled in the art.

While there have been described what are at present considered to be certain embodiments of the invention, it will be understood that various modifications may be made thereto, and it is intended that the appended claims cover all such modifications that fall within the true spirit and scope of the invention.

What is claimed is:

1. A display device comprising:
a plurality of pixel electrodes which are provided separately from each other on an insulative surface;
a first layer which is provided on the plurality of pixel electrodes, and includes a plurality of first carrier transport layers or a plurality of first carrier injection layers;
a pixel separation film which is provided on the first layer so as to cover a part of the first layer, and includes a plurality of opening portions in each region which overlaps with the respective plurality of pixel electrodes in a planar view;
a light emitting layer which is provided so as to cover at least one of the plurality of opening portions;
a second layer which is provided on the light emitting layer, and includes a second carrier transport layer or a second carrier injection layer; and
a counter electrode which is provided on the second layer.

2. The display device according to claim 1,
wherein the first layer is separately provided between the respective plurality of pixel electrodes.
3. The display device according to claim 1,
wherein the first layer is continuously provided over the plurality of pixel electrodes.
4. The display device according to claim 1,
wherein carrier mobility of the first layer which overlaps the pixel separation film in a planar view is lower than carrier mobility of the first layer which is exposed from the pixel separation film in a planar view.
5. The display device according to claim 1,
wherein the light emitting layer is formed independently from each other so as to correspond to the respective plurality of pixel electrodes.
6. The display device according to claim 1,
wherein the light emitting layer is continuously formed over the plurality of pixel electrodes in a planar view.
7. A display device comprising:
a plurality of pixel electrodes which are provided separately from each other on an insulative surface;
a plurality of first layers which correspond to the respective plurality of pixel electrodes thereon, are provided separately from each other, and include a plurality of first carrier transport layers or a plurality of first carrier injection layer;
a light emitting layer which is provided on the plurality of first layers;
a second layer which is provided on the light emitting layer, and includes a second carrier transport layer or a second carrier injection layer; and
a counter electrode which is provided on the second layer,
wherein carrier mobility of the first layer which does not overlap one of the plurality of pixel electrodes in a planar view is lower than carrier mobility of the first layer which overlaps one of the plurality of pixel electrodes in a planar view.
8. A display device comprising:
a plurality of pixel electrodes which are provided separately from each other on an insulative surface;
a first layer which is continuously provided on the plurality of pixel electrodes, and includes a first carrier transport layer or a first carrier injection layer;
a light emitting layer which is provided on the first layer;
a second layer which is provided on the light emitting layer, and includes a second carrier transport layer or a second carrier injection layer; and
a counter electrode which is provided on the second layer,
wherein the first layer includes an intermediate portion which is provided between two adjacent pixel electrodes of the plurality of pixel electrodes in a planar view, and carrier mobility of the intermediate portion is lower than carrier mobility of a portion which is provided on the pixel electrode in the first layer.
9. The display device according to claim 8,
wherein the light emitting layer is formed independently from each other so as to correspond to the respective plurality of pixel electrodes.
10. The display device according to claim 8,
wherein the light emitting layer is continuously formed over the plurality of pixel electrodes in a planar view.

* * * * *